United States Patent
Lee et al.

(10) Patent No.: US 7,800,172 B2
(45) Date of Patent: Sep. 21, 2010

(54) METHODS OF FORMING SEMICONDUCTOR DEVICES HAVING MULTIPLE CHANNEL MOS TRANSISTORS AND RELATED INTERMEDIATE STRUCTURES

(75) Inventors: Sung-Young Lee, Gyeonggi-do (KR);
Sung-Min Kim, Incheon-si (KR);
Dong-Gun Park, Gyeonggi-do (KR);
Chang-Woo Oh, Gyeonggi-do (KR);
Eun-Jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 416 days.

(21) Appl. No.: 11/941,656

(22) Filed: Nov. 16, 2007

(65) Prior Publication Data

US 2008/0093628 A1 Apr. 24, 2008

Related U.S. Application Data

(62) Division of application No. 10/974,410, filed on Oct. 27, 2004, now Pat. No. 7,316,968.

(30) Foreign Application Priority Data

Nov. 21, 2003 (KR) .............................. 2003-82824

(51) Int. Cl.
*H01L 29/66* (2006.01)

(52) U.S. Cl. ..................... 257/331; 257/332; 257/401; 438/197; 438/666

(58) Field of Classification Search ................... 257/66, 257/331, 332, 401; 438/197, 487, 497, 666
See application file for complete search history.

(56) References Cited

U.S. PATENT DOCUMENTS

| | | | |
|---|---|---|---|
| 4,996,574 A | 2/1991 | Shirasaki | 257/66 |
| 5,965,914 A | 10/1999 | Miyamoto | 257/331 |
| 6,413,802 B1 | 7/2002 | Hu et al. | 438/151 |
| 6,440,806 B1 | 8/2002 | Xiang | 438/290 |
| 6,965,138 B2 * | 11/2005 | Nakajima et al. | 257/295 |
| 7,002,207 B2 * | 2/2006 | Kim et al. | 257/331 |

FOREIGN PATENT DOCUMENTS

| | | |
|---|---|---|
| JP | 2002057329 | 2/2002 |
| JP | 2002203971 | 7/2002 |
| KR | 1020030013586 | 2/2003 |
| KR | 10-0481209 | 3/2005 |

OTHER PUBLICATIONS

Notice to Submit a Response for Korean Patent Application No. 10-2003-0082824 mailed on Jul. 28, 2005.

* cited by examiner

*Primary Examiner*—Thinh T Nguyen
(74) *Attorney, Agent, or Firm*—Myers Bigel Sibley & Sajovec

(57) ABSTRACT

In a method of manufacturing a semiconductor device, a preliminary active pattern including gate layers and channel layers is formed on a substrate. The gate layers and the channel layers are alternatively stacked. A hard mask is formed on the preliminary active pattern. The preliminary active pattern is partially etched using the hard mask as an etching mask to expose a surface of the substrate. The etched preliminary active pattern is trimmed to form an active channel pattern having a width less than a lower width of the hard mask. Source/drain layers are formed on exposed side faces of the active channel pattern and the surface. The gate layers are selectively etched to form tunnels. A gate encloses the active channel pattern and filling the tunnels. Related intermediate structures are also disclosed.

7 Claims, 19 Drawing Sheets

METHODS OF FORMING SEMICONDUCTOR DEVICES HAVING MULTIPLE CHANNEL MOS TRANSISTORS AND RELATED INTERMEDIATE STRUCTURES

CROSS REFERENCE TO RELATED APPLICATION

This application claims priority under 35 U.S.C. §120 as a divisional application of U.S. patent application Ser. No. 10/974,410, filed Oct. 27, 2004 U.S. Pat. No. 7,316,968, which in turn claims priority under 35 U.S.C. §119 to Korean Patent Application No. 2003-82824, filed on Nov. 21, 2003. The disclosures of the above applications are incorporated herein by reference as if set forth in there entireties.

FIELD OF THE INVENTION

The present invention relates to methods of manufacturing semiconductor devices and, more particularly, to methods of manufacturing MOS transistor semiconductor devices.

BACKGROUND OF THE INVENTION

As semiconductor devices become more highly integrated, the size of the active region of the device on which circuits are formed becomes smaller. As a result, the channel length of a MOS transistor that is formed on the active region is reduced. It will be understood by those having skill in the art that as used herein, the term "MOS" refers to any insulated gate field effect transistor, the gate of which comprises metal and/or nonmetal (such as polysilicon) and the insulator of which comprises oxide and/or other insulators (such as high dielectric constant insulators).

As the channel length of the MOS transistor is reduced, the source and drain may have an increased effect on the electric field/electric potential in the channel region. This phenomenon is referred to as the short channel effect. Additionally, when the width of the channel is narrowed as the size of the active region is reduced, the threshold voltage of the MOS transistor may be lowered. This phenomenon is referred to as a reverse narrow width effect.

Methods for reducing the size of semiconductor devices and for improving the performance of such devices have been developed. For example, U.S. Pat. No. 6,413,802 discloses methods for providing a vertical MOS transistor having a fin structure that comprises a plurality of thin channel fins between a pair of source/drain regions and a gate electrode that is formed on both sides of the channel fins. U.S. Pat. No. 4,996,574 discloses a MOS transistor having a DELTA structure that has a channel layer that includes a vertically protruded portion which is surrounded by a gate electrode. MOS transistor having a gate all around (GAA) structure have also been proposed. In these transistors, an active pattern as an SOI layer may be formed on a substrate. A gate electrode surrounds the channel region of the active pattern, on which an insulation layer is formed.

SUMMARY OF THE INVENTION

Pursuant to embodiments of the present invention, methods of manufacturing a MOS transistor are provided in which a stacked structure comprising a first semiconductor layer on a substrate, a second semiconductor layer on the first semiconductor layer, a third semiconductor layer on the second semiconductor layer and a fourth semiconductor layer on the third semiconductor layer is formed. A hard mask pattern is formed on at least a portion of the fourth semiconductor layer. The first, second, third and fourth semiconductor layers are partially etched, and then trimmed to form an active pattern that extends above the upper surface of the substrate and has first and second sidewalls that are substantially vertical. A semiconductor layer is grown on the first and second sidewalls of the active pattern to form a pair of source/drain regions, and then portions of the first and third semiconductor layers are selectively etched to form a pair of tunnels in the active pattern that extend from the front to the rear side of the pattern. A conductive gate is then formed on the top surface of the active pattern and in the tunnels.

In some embodiments, the first and third semiconductor layers may have an etching selectivity with respect to the second and fourth semiconductor layers. The trimming process may trim the width of the first, second, third and fourth semiconductor layers to a width that is less than the width of a lower surface of the hard mask pattern. In still other embodiments, a spacer may be formed on opposing sidewalls of the hard mask pattern. In these embodiments, the etched first, second, third and fourth semiconductor layers may be trimmed to have a width that is less than the combined width of a lower surface of the hard mask pattern and the spacer. The trimming may be performed by isotropically etching the etched first, second, third and fourth semiconductor layers using an etchant that has little etching selectivity between the first, second, third and fourth semiconductor layers.

In certain embodiments, the hard mask pattern may have a trapezoidal shape. The method may also include removing the hard mask pattern and thereafter forming spacers on the top surface of the source/drain regions. A gate insulation layer may also be formed on an inner surface of each tunnel, on a sidewall of each spacer and on the active pattern.

According to further embodiments of the present invention, methods of manufacturing a semiconductor device are provided in which a preliminary active pattern is formed on a substrate. The preliminary active pattern includes at least two gate layers and at least two channel layers that are alternatively stacked. A hard mask may be formed on the preliminary active pattern, and then the preliminary active pattern may be partially etched using the hard mask as an etching mask. Thereafter, the width of the etched preliminary active pattern may be trimmed to form an active channel pattern, and a semiconductor layer is grown on first and second exposed sides of the active channel pattern and a top surface of the substrate to form source/drain regions. Additionally, the gate layers may be selectively etched to form tunnels therethrough, and an upper gate is formed on the upper face of the active channel pattern and a lower gate is formed on the front and rear sides of the active channel pattern and in the tunnels.

In certain embodiments of these methods, the channel layers and the gate layers are formed of different materials that have an etching selectivity with respect to each other, such as silicon and germanium or silicon-germanium. During formation of the source/drain regions first impurities may be implanted into portions of the semiconductor layer grown on the first and second exposed side faces of the active channel pattern and the top surface of the substrate. A top surface portion of the substrate that is positioned beneath the lowest gate layer may be doped with second impurities to form a channel isolation region, where the second impurities have a conductivity type that is opposite the conductivity type of the first impurities.

In these methods, the upper width of the hard mask may be less than the lower width of the hard mask. The hard mask may be formed by successively stacking an etch stop layer and a dummy gate layer on the preliminary active pattern and then partially etching these layers to form a hard mask having a side face inclined to an upper face of the hard mask. A spacer that has an etch selectivity with respect to the dummy gate layer may also be formed on a side face of the hard mask. The spacer and the etch stop layer may be formed of substantially identical materials.

Pursuant to still further embodiments of the present invention, intermediate structures are provided that are formed during the fabrication of multi-channel MOS transistors. The intermediate structure comprises an active channel pattern on a substrate, the active channel pattern comprising a first semiconductor layer on the substrate, a second semiconductor layer on the first semiconductor layer, a third semiconductor layer on the second semiconductor layer and a fourth semiconductor layer on the third semiconductor layer. The first and third semiconductor layers have an etching selectivity with respect to the second and fourth semiconductor layers. A hard mask is provided on the active channel pattern, where the width of a lower portion of the hard mask exceeds the width of an upper portion of the hard mask.

In certain embodiments of these intermediate structures, the width of the active channel pattern may be less than the width of the hard mask. The hard mask may comprise a stacked structure that includes a dummy gate pattern on an etch stop layer pattern. The hard mask may have a trapezoidal-shaped cross-section. In other embodiments, the hard mask may comprise a dummy gate pattern on an etch stop layer pattern, and first and second spacers that are provided on sidewalls of the dummy gate pattern and the etch stop layer pattern. The active channel pattern may have substantially vertical sidewalls that extend above an upper surface of the substrate. Source/drain regions may also be provided on the sidewalls of the active channel pattern. The intermediate structure may also include an insulation layer on the active channel pattern, the first and second semiconductor source/drain regions and the hard mask.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1A:
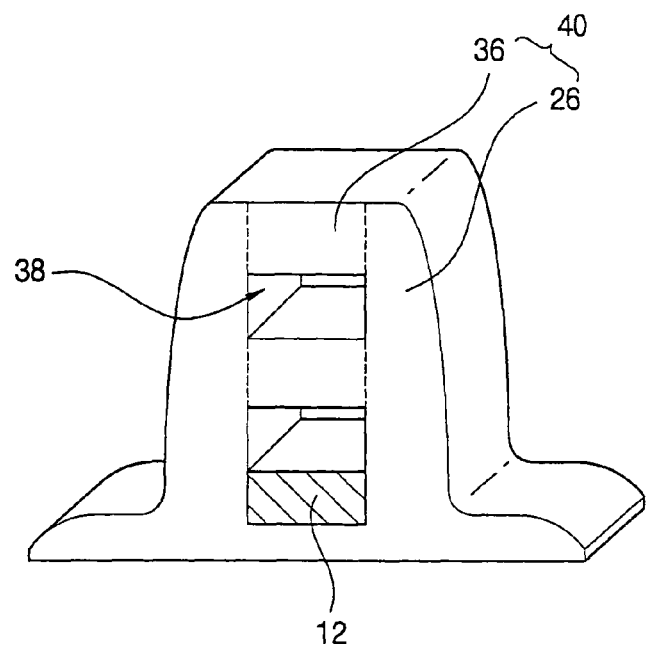
FIG. 1A is a perspective view illustrating an active pattern of a MOS transistor having multiple channels in accordance with embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures. Herein the substrate is described as a lower or the lowest layer of the devices described herein, but it will be appreciated that the substrate could be positioned in a different orientation without departing from the scope of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a perspective view illustrating an active pattern 40 of a multi-channel MOS transistor. The active pattern 40 is formed on a semiconductor substrate (not shown), and includes an active channel pattern 36 that has multiple, vertically-disposed, channel regions. The active channel pattern 36 has vertical side faces. The active pattern 40 also includes source/drain layers 26 that are formed on the side faces of the active channel pattern 36 and a surface of the substrate.

Tunnels 38, which define the channel regions are provided through the active channel pattern 36. The active channel pattern 36 is doped with N-type impurities or P-type impurities in accordance with the type of the transistor. For example, to form an N-type transistor, the active channel pattern 36 is doped with a low concentration of P-type impurities.

In the embodiment depicted in FIG. 1A, two tunnels 38 are formed through the active channel pattern 36. A lower gate is formed in each tunnel. It will be appreciated by those of skill in the art that a single tunnel 38 or three or more tunnels 38 may be included in alternative embodiments of the present invention.

The source/drain layers 26 are doped with impurities that are the opposite to the impurity type used to dope the channel regions. For example, when the transistor is an N-type transistor, the source/drain layers 26 are doped with N-type impurities.

As shown in FIG. 1A, the active pattern 40 includes a protruded central portion having an upper face and side faces that are substantially perpendicular to the upper face. The tunnels 38 are formed through the protruded central portion to define the channel regions of the transistor.

Figure 1B:
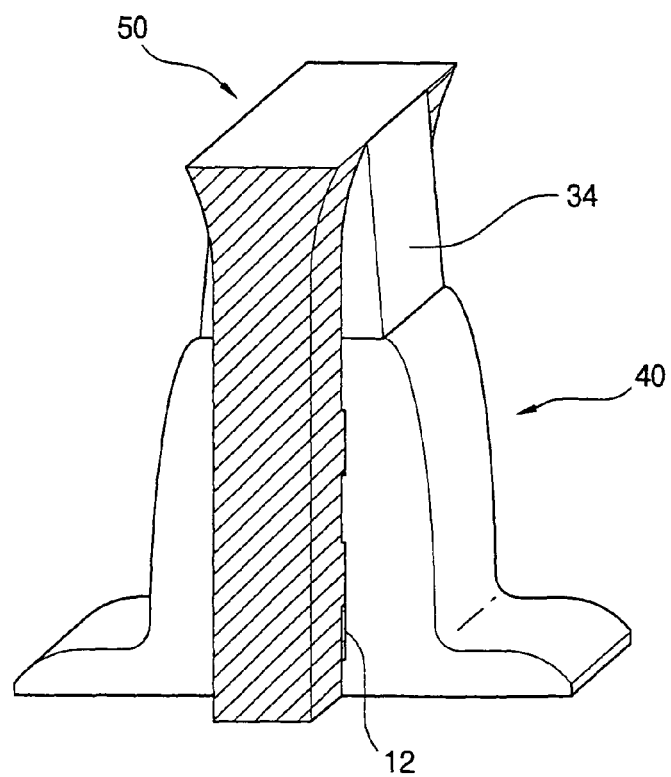
FIG. 1B is a perspective view illustrating a gate electrode of the MOS transistor of FIG. 1A.
Figure 2:
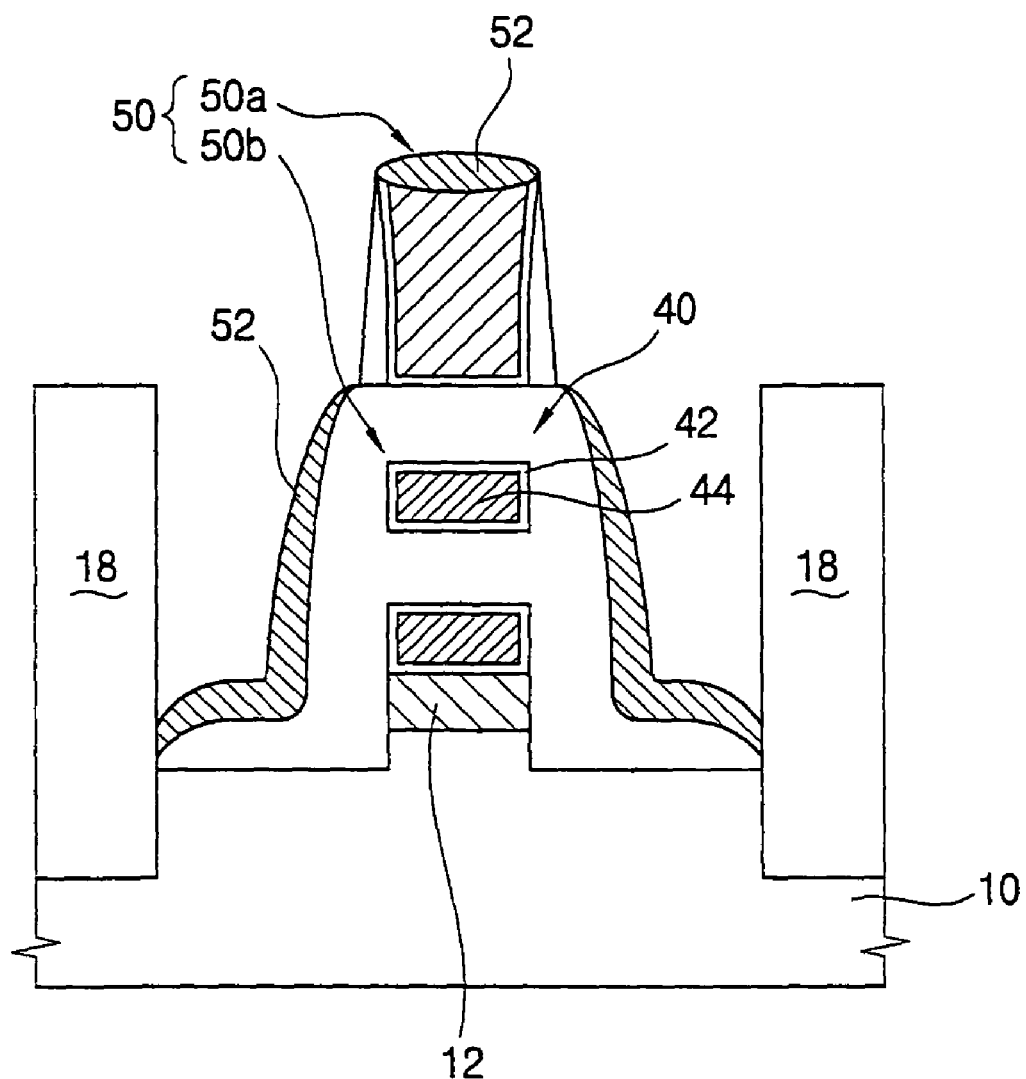
FIG. 2 is a cross sectional view illustrating the MOS transistor of FIGS. 1A and 1B.

Referring to FIGS. 1B and 2, a gate 50 surrounds the channel regions and extends into, and in some embodiments, fills, the tunnels 38. The gate 50 also extends above the upper face of the active pattern 40.

The gate 50 includes a gate insulation layer 42 that is formed on inner faces of the tunnels 38 and the upper face of the active pattern 40. The gate insulation layer 42 may comprise, for example, a thermal oxide layer, an oxide/nitride/oxide (ONO) layer, etc. The gate 50 further includes a conductive layer pattern 44 that is formed on the gate insulation layer 42. The conductive layer pattern 44 may, for example, comprise a polysilicon and/or metal layer.

Herein, the portion of the gate 50 that extends from the upper face of the active pattern 40 is referred to as the upper gate 50a. The remaining portions of the gate 50, including the portions formed in the tunnels 38, are referred to as the lower gate 50b. A metal layer or a metal silicide layer 52 may be formed on an upper face of the upper gate 50a. The layer 52 may facilitate reducing the gate resistance. An oxide spacer 34, such as, for example, a silicon oxide spacer, may be formed on side faces of the upper gate 50a.

The semiconductor substrate may, for example, comprise a bulk silicon (Si) substrate, a silicon germanium (SiGe) substrate, a silicon-on-insulator (SOI) substrate, a silicon germanium-on-insulator (SGOI) substrate, etc.

When the semiconductor substrate is a bulk silicon substrate, a channel isolation region 12 may be provided beneath the lowest tunnel 38. The channel isolation region 12 may comprise a portion of the substrate that is doped with impurities that are the opposite of the impurities used to dope the source/drain layers 26. When the semiconductor substrate comprises an SOI substrate or an SGOI substrate, an insulator may be used to form the channel isolation region 12. The channel isolation region 12 may reduce or prevent a channel from forming beneath the lowest tunnel 38, thereby reducing the short channel effect.

The active channel pattern 36 may comprise a single crystalline semiconductor layer or layers. In embodiments of the present invention, the active channel pattern 36 comprises a single crystalline silicon layer(s). The source/drain layers 26 may be a single crystalline semiconductor layer, such as, for example, a silicon layer. Additionally, the metal layer or metal silicide layer 52 (see FIG. 2) may also be formed on surfaces of the source/drain layers 26 to reduce the resistance of the source/drain regions 26.

In certain embodiments of the present invention, the source/drain layers 26 may have a uniform doping profile in a direction substantially perpendicular to the length direction of the channel regions. Accordingly, although the length of the channel regions is increased, a relatively uniform source/drain junction capacitance may be maintained. As a result, the speed of the semiconductor device may be improved by increasing the current and reducing the junction capacitance.

Hereinafter, methods of manufacturing a semiconductor device in accordance with some embodiments of the present invention are discussed in detail.

Figure 3A:
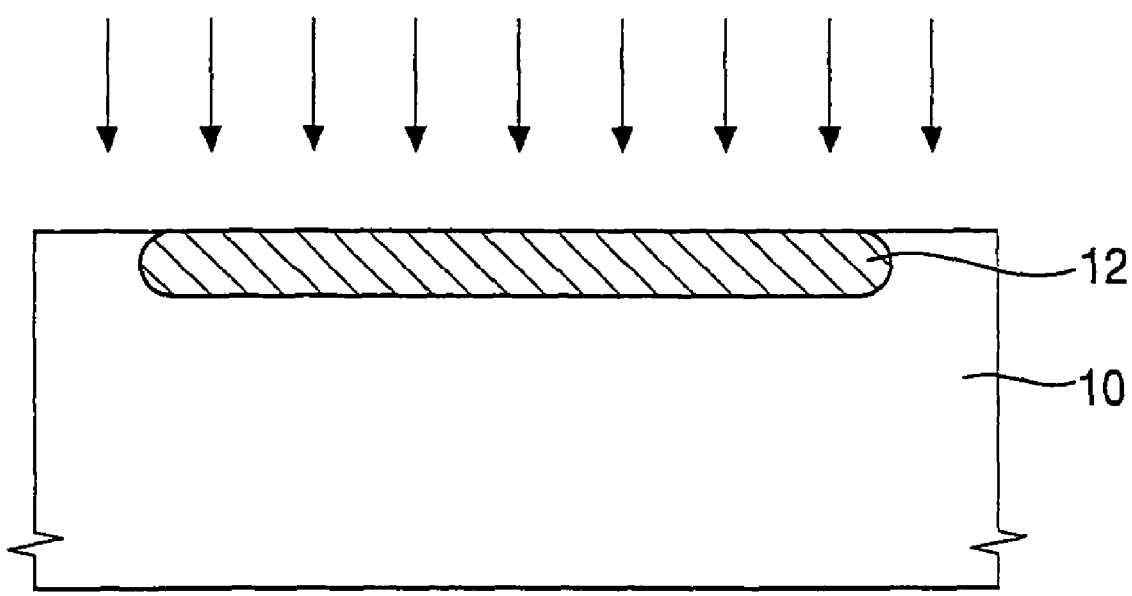
FIGS. 3A to 3O are cross sectional views illustrating methods of manufacturing semiconductor devices in accordance with first embodiments of the present invention.
Figure 3B:
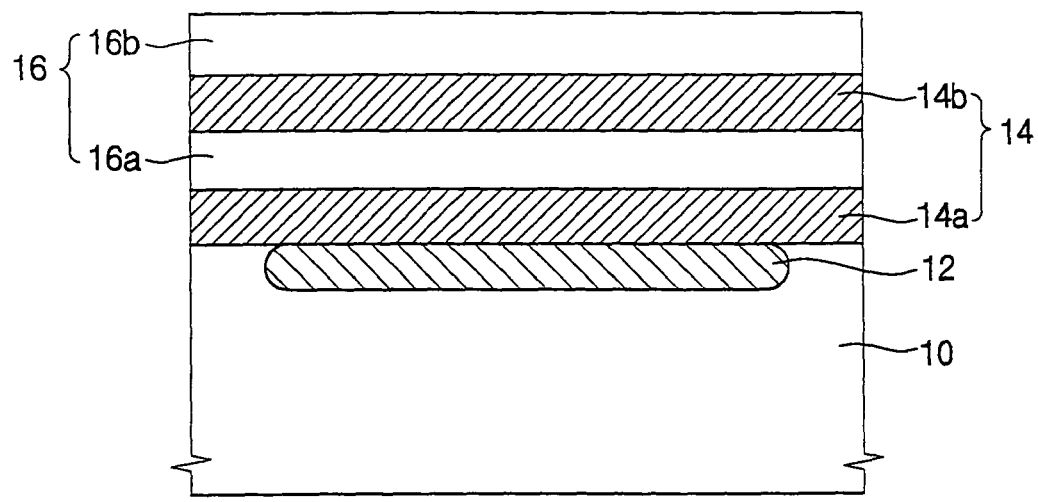
Figure 3C:
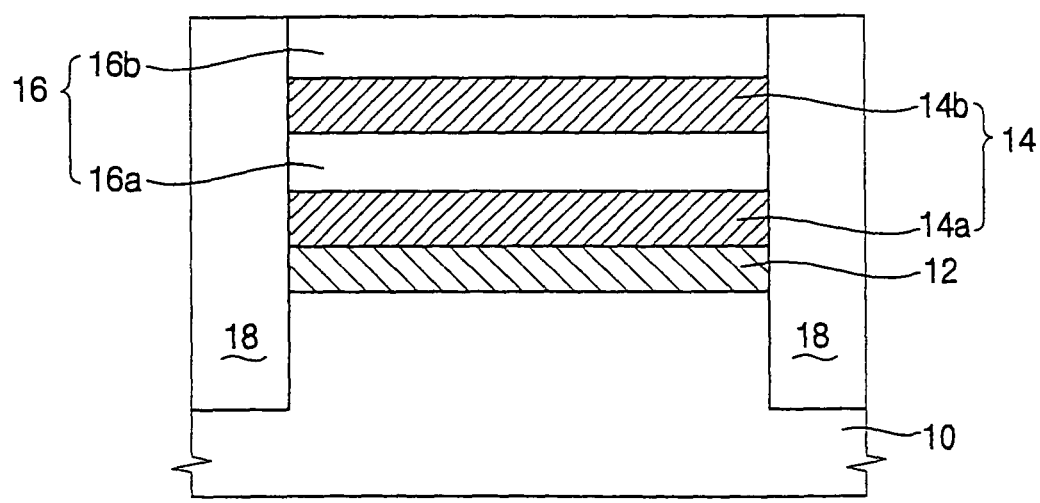
Figure 3D:
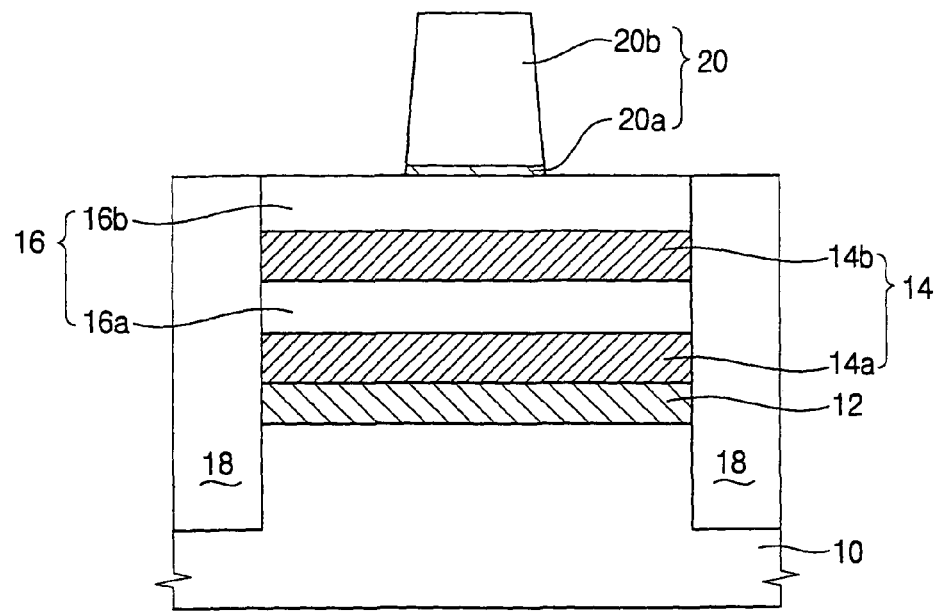
Figure 3E:
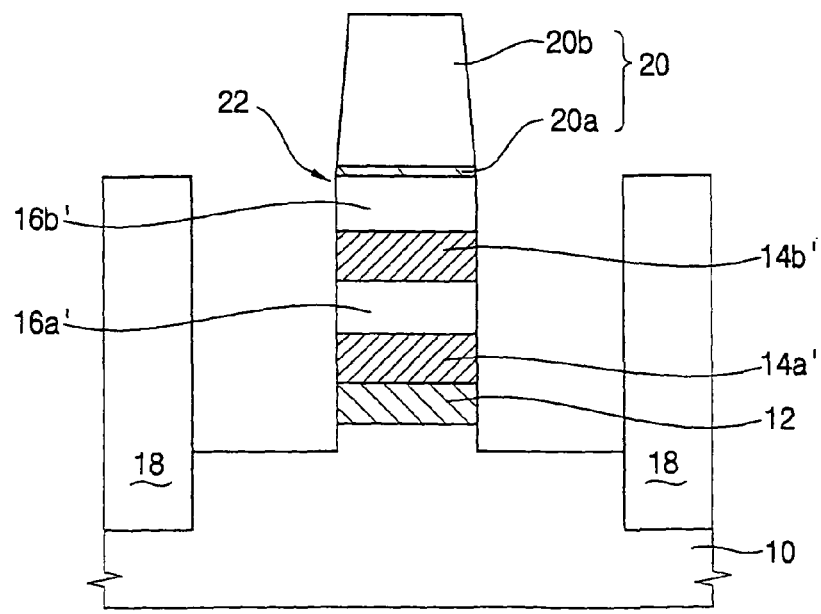
Figure 3F:
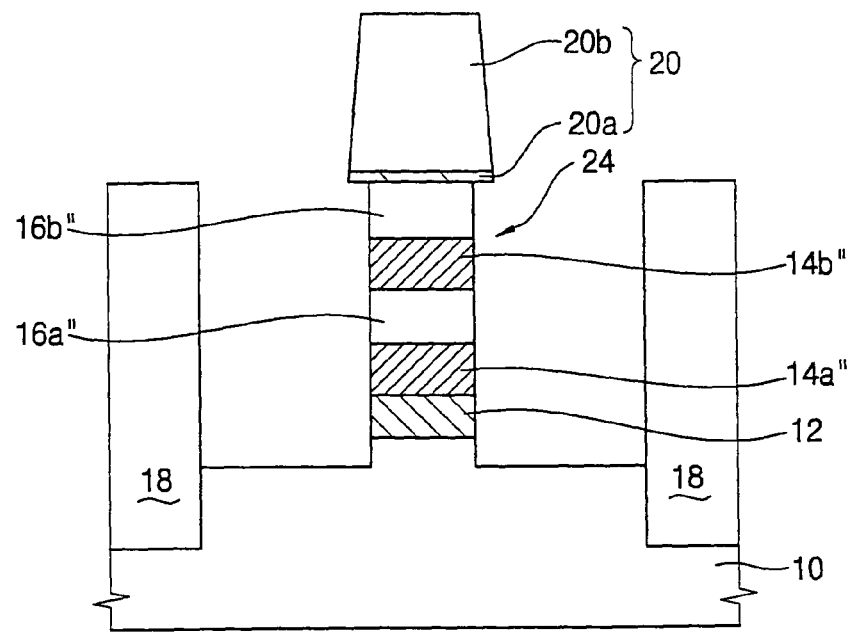
Figure 3G:
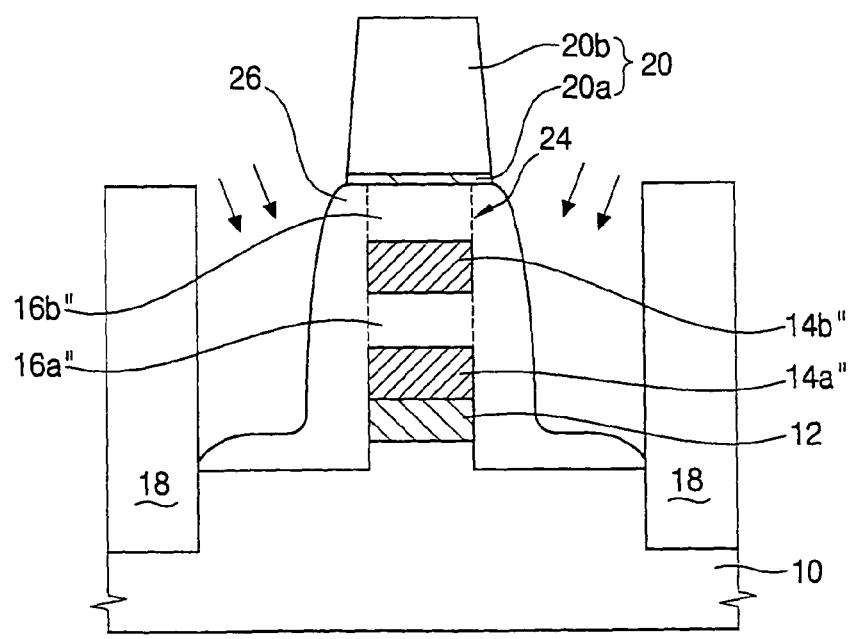
Figure 3H:
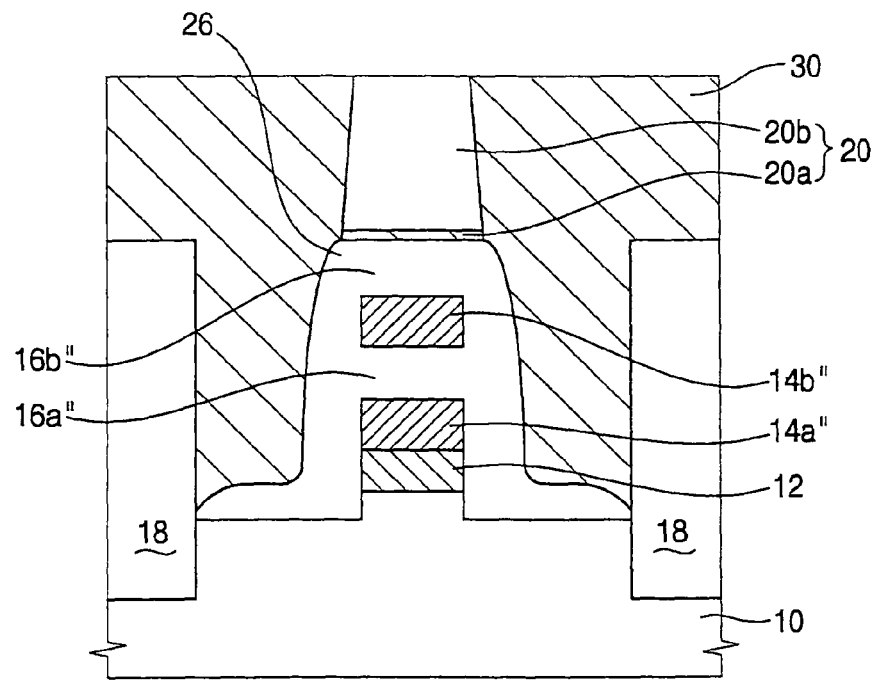
Figure 3I:
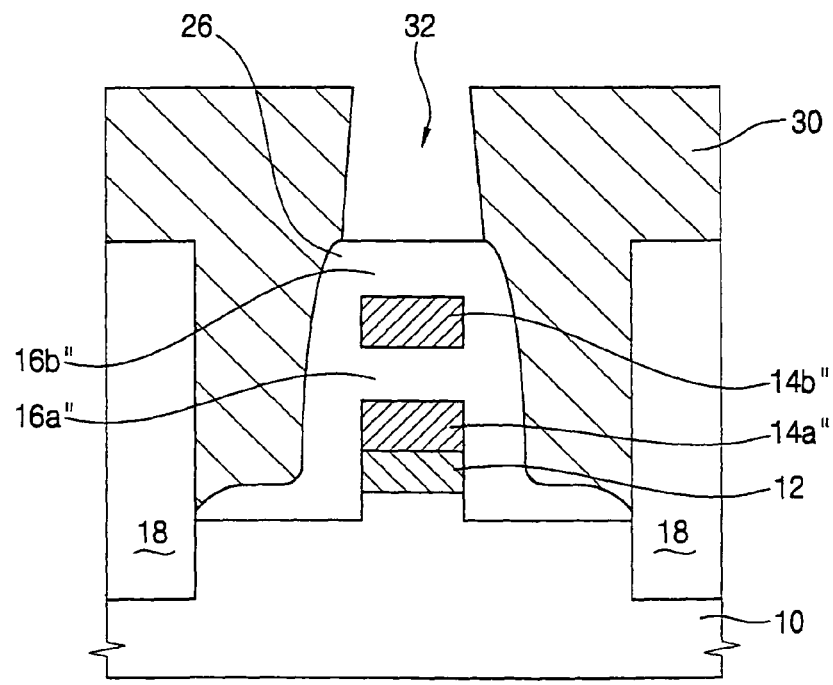
Figure 3J:
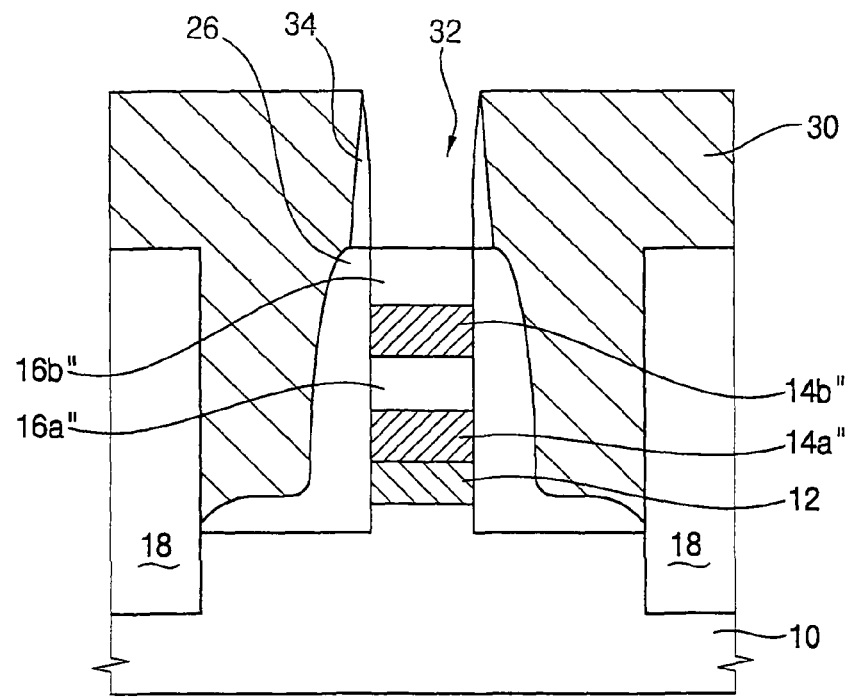
Figure 3K:
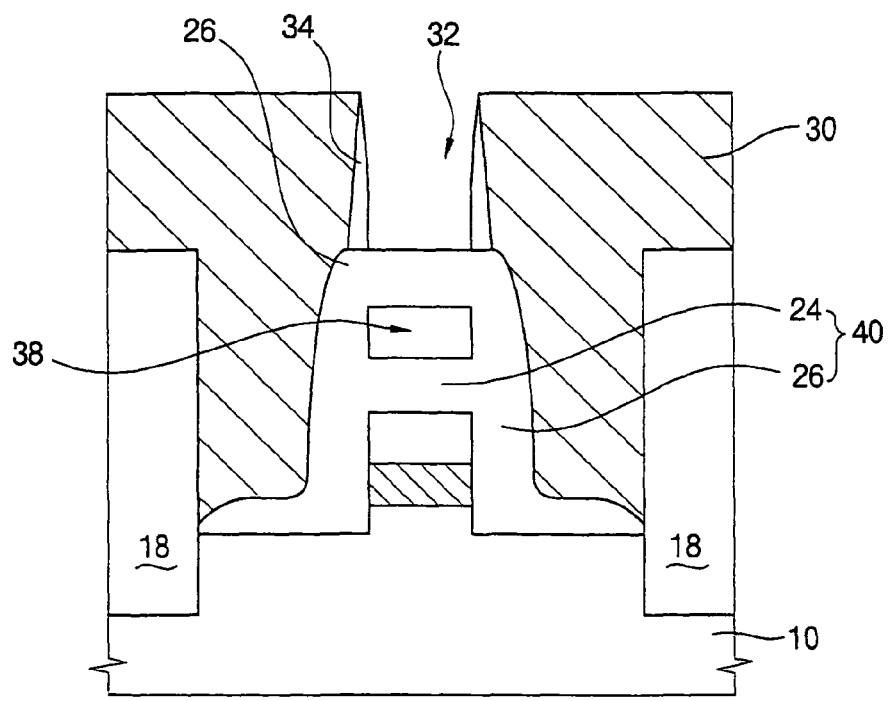
Figure 3L:
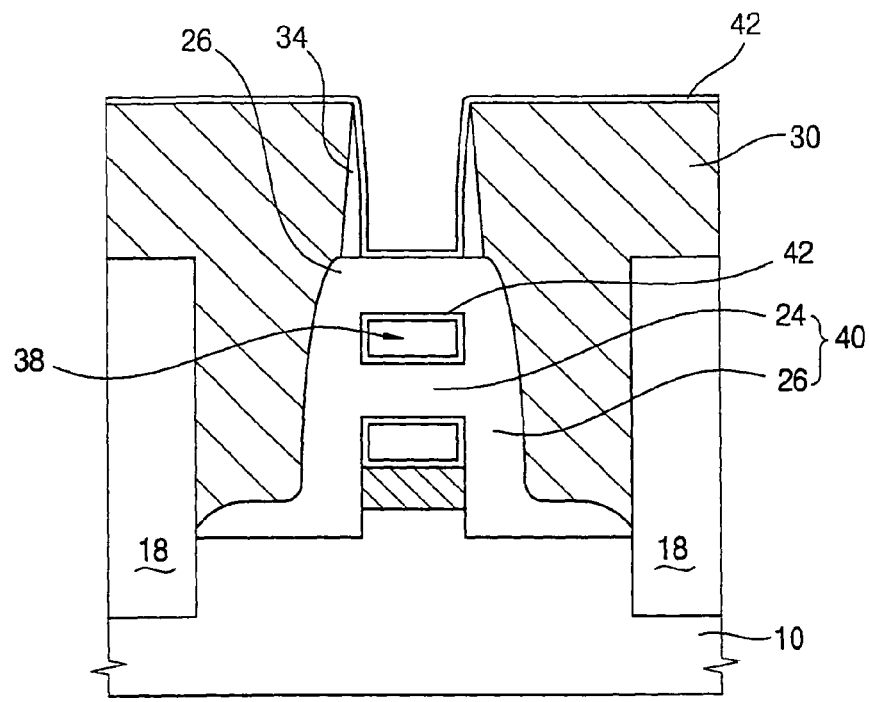
Figure 3M:
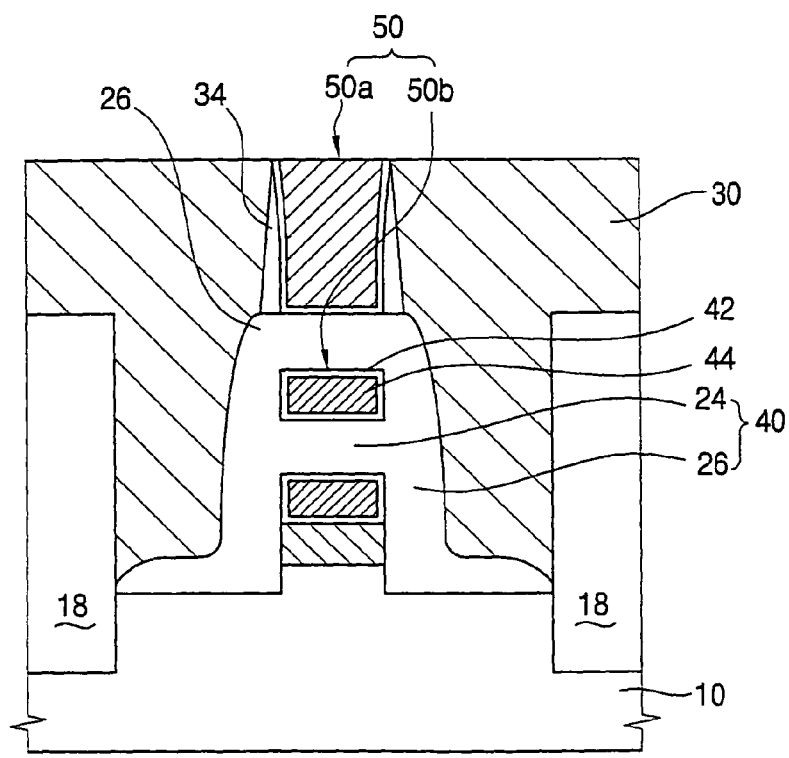
Figure 3N:
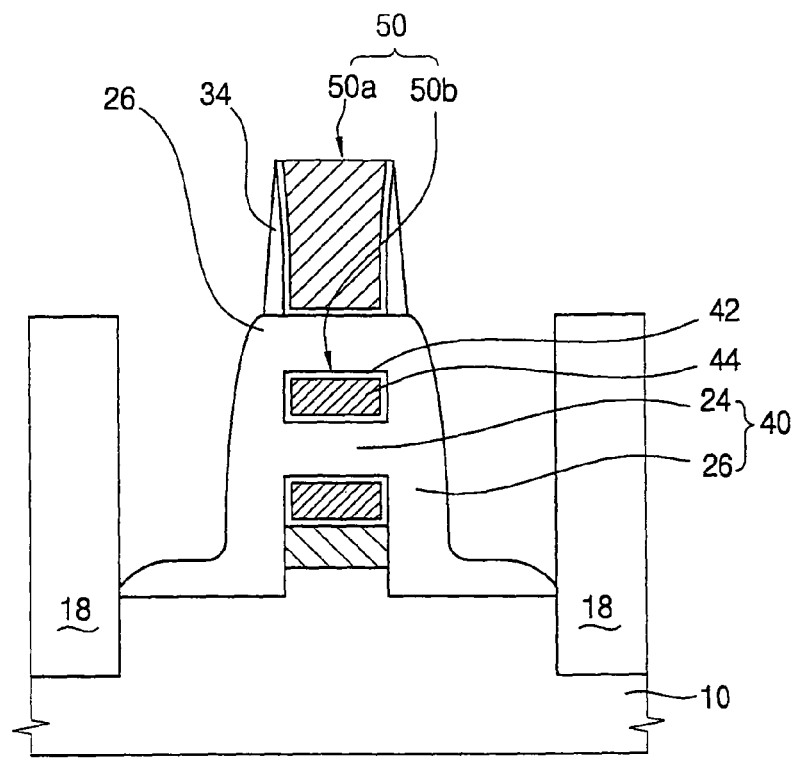
Figure 3O:
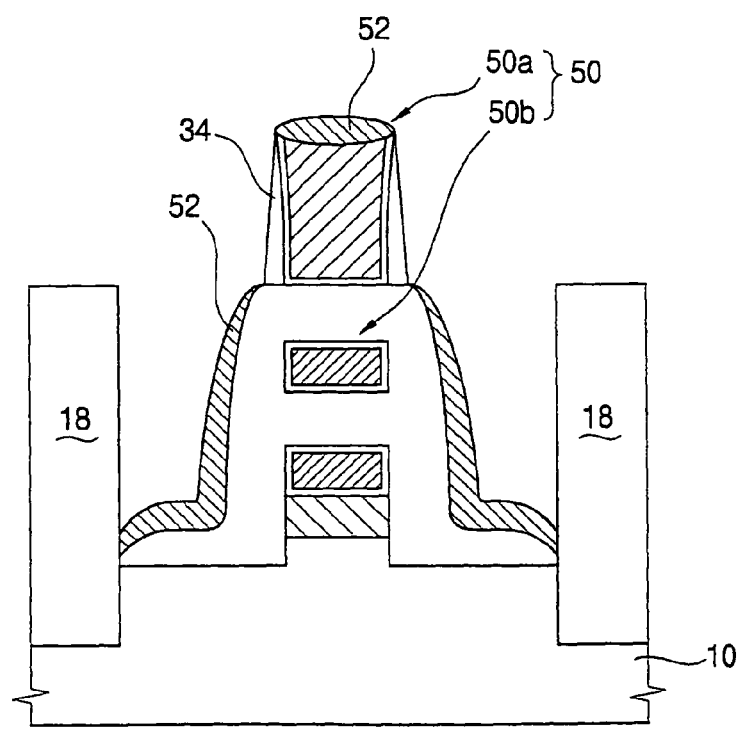
Figure 4A:
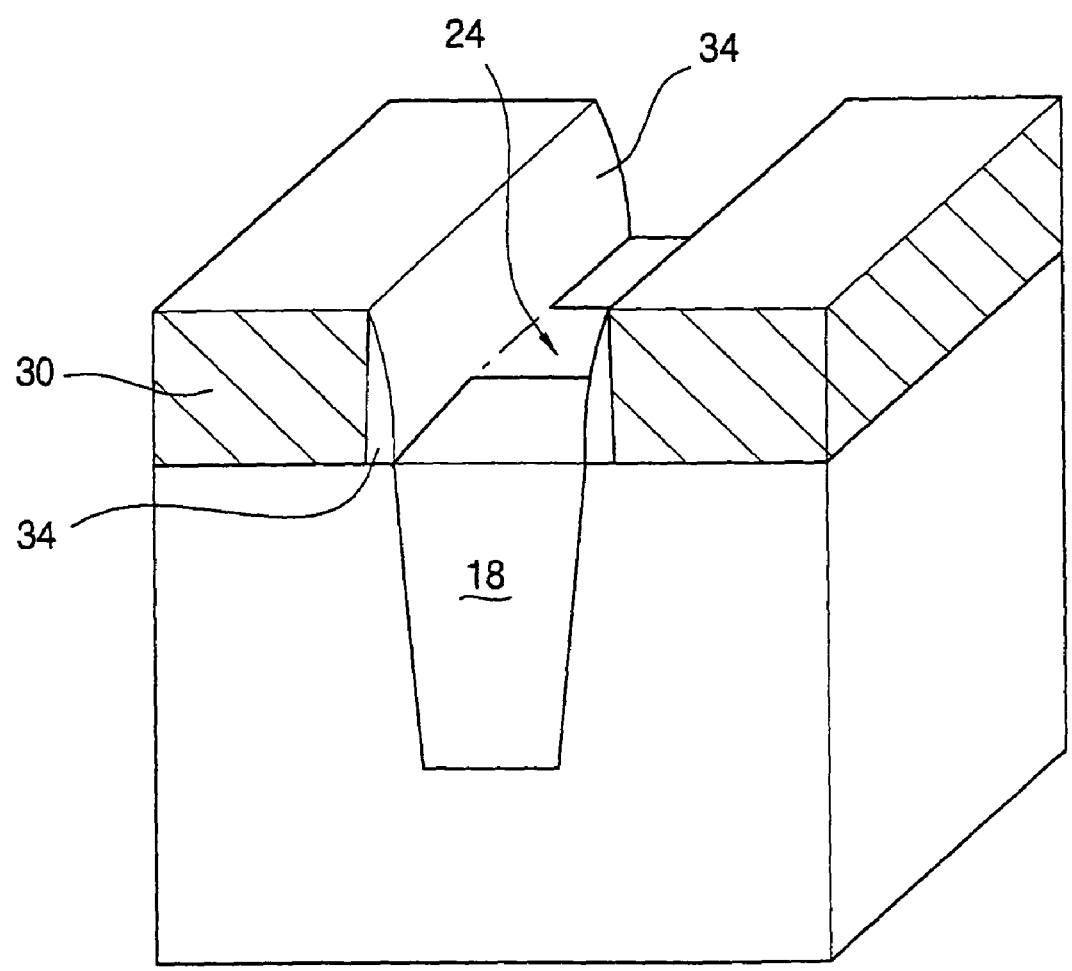
FIGS. 4A to 4C are perspective views further illustrating the methods of manufacturing semiconductor devices in accordance with the first embodiments of the present invention.
Figure 4B:
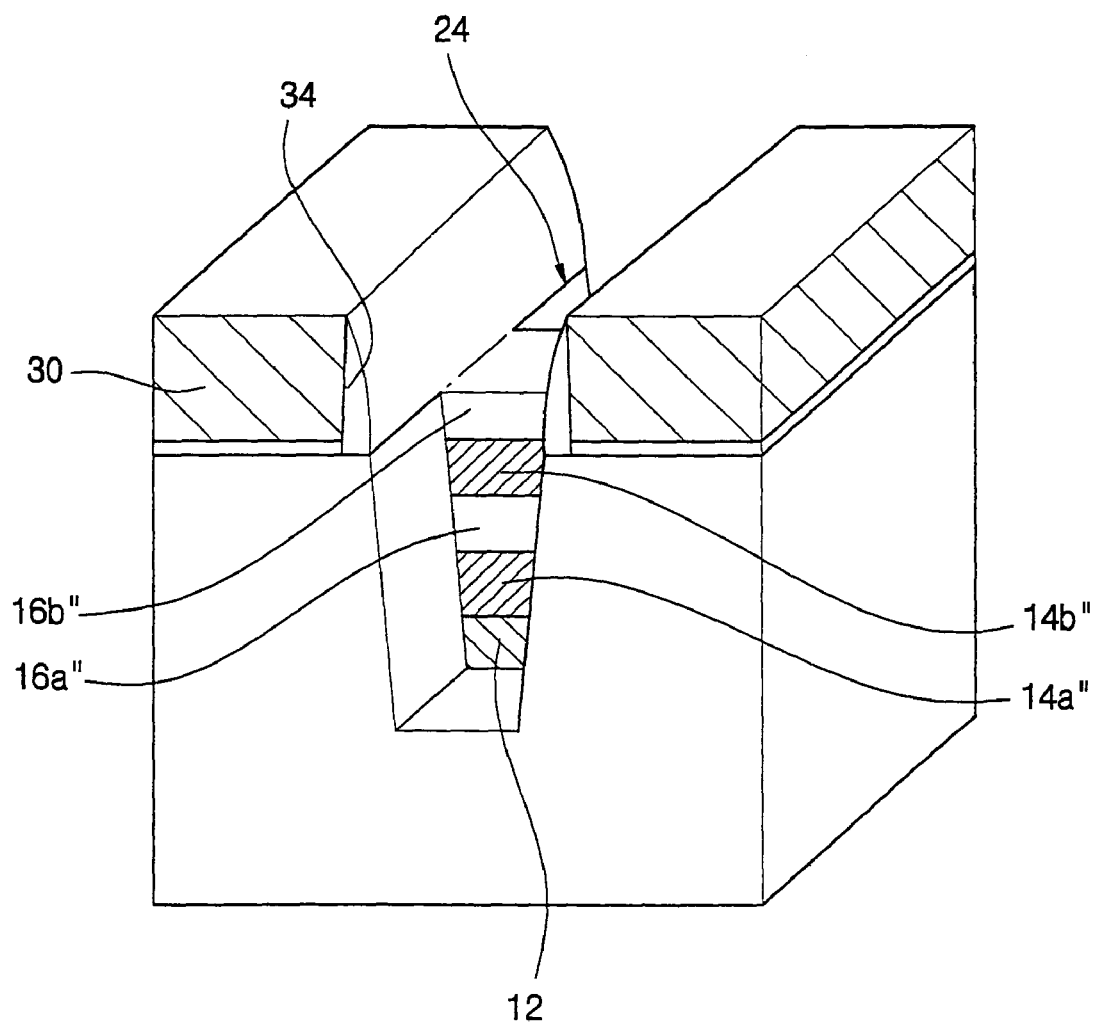
Figure 4C:
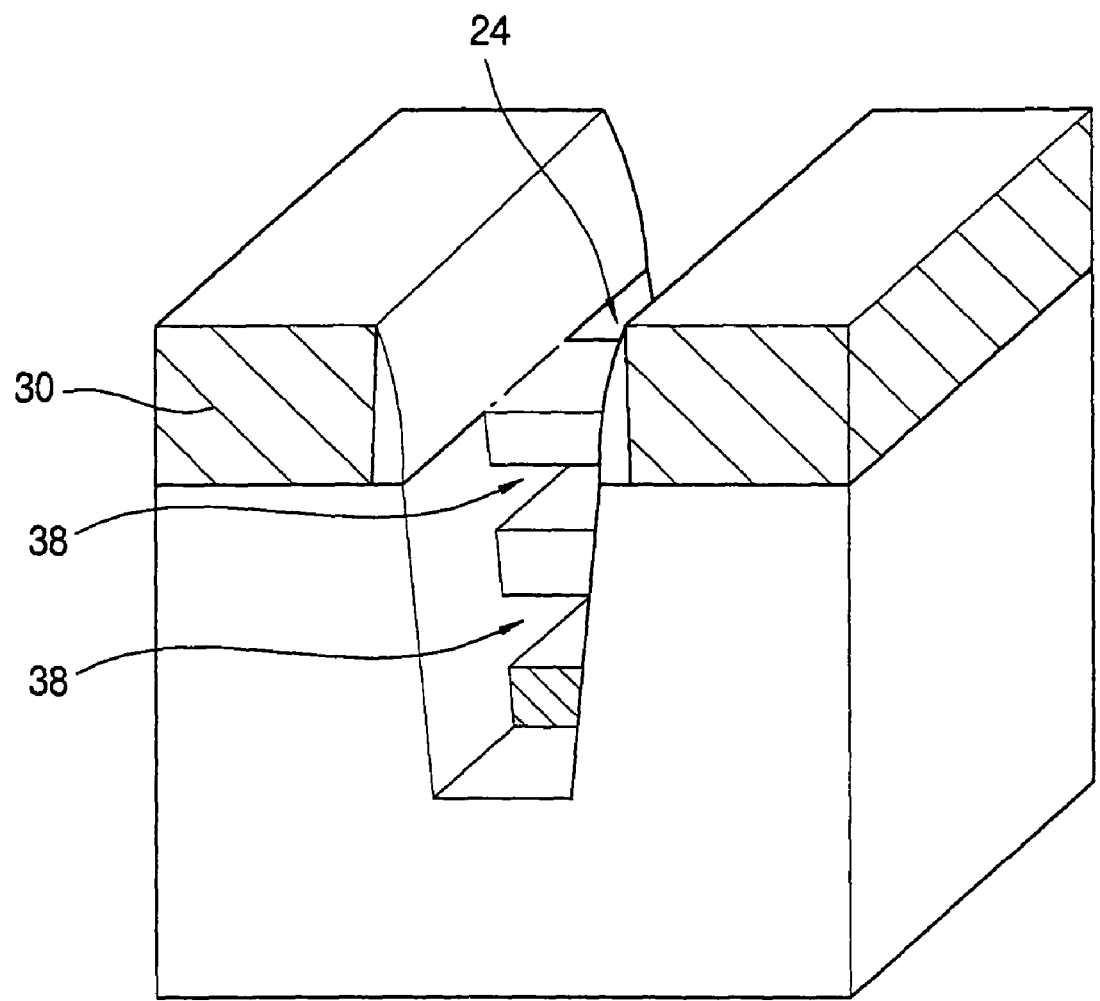

FIGS. 3A to 3O are cross sectional views that illustrate methods of manufacturing a semiconductor device in accordance with certain embodiments of the present invention. FIGS. 4A to 4C are perspective views which further illustrate these methods of manufacturing a semiconductor device.

Referring to FIG. 3A, a semiconductor substrate 10 is provided. The semiconductor substrate 10 may, for example, comprise a bulk silicon substrate, a silicon-germanium substrate, a silicon-on-insulator substrate, a silicon-germanium-on-insulator substrate or various other substrates.

As shown in FIG. 3A, impurities may be implanted into the surface of the semiconductor substrate 10 to form a channel isolation region 12. These impurities are of a conductivity type that is the opposite of the conductivity type of the impurities that are implanted into the source/drain regions of the transistor. The channel isolation region 12 may serve to reduce and/or minimize the short channel effect in transistors formed on bulk semiconductor substrates.

When the semiconductor substrate 10 comprises a bulk silicon substrate or a silicon germanium substrate, the process for forming the channel isolation region 12 may be performed. However, when the semiconductor substrate 10 comprises a silicon-on-insulator substrate or a silicon-germanium-on-insulator substrate, the process for forming the channel isolation region 12 may be omitted and the insulator may be used as the channel isolation region.

Referring to FIG. 3B, gate layers 14 and channel layers 16 are alternatively formed on the semiconductor substrate 10. In some embodiments, a first gate layer 14a is formed on the substrate 10, and a first channel layer 16a is formed on the first gate layer 14a. A second gate layer 14b is then formed on the first channel layer 16a, and a second channel layer 16b is formed on the second gate layer 14b.

In certain embodiments of the present invention, the channel layers 16a, 16b may comprise a first single crystalline semiconductor material and the gate layers 14a, 14b may comprise a second single crystalline semiconductor material that has an etching selectivity with respect to the first single crystalline semiconductor material. By way of example, the channel layers 16a, 16b may comprise silicon layers having a thickness of about 300 Å and the gate layers 14a, 14b may comprise germanium layers or silicon-germanium layers having a thickness of about 300 Å. In alternative embodiments, the channel layers 16a, 16b and the gate layers 14a, 14b may be formed by an epitaxial growth process and may be formed of materials that may or may not have etch selectivity with respect to each other.

The thickness and the number of the channel layers 16a, 16b and gate layers 14a, 14b may be varied. In the present embodiment, the entire thickness of the channel layers 16a, 16b and the gate layers 14a, 14b is about 1,000 Å to about 1,500 Å. The channel layers 16a, 16b may be doped, for example, by implanting impurities or by forming the channel layers 16a, 16b using doped single crystalline silicon layers.

Referring to FIG. 3C, the channel layers 16a, 16b, the gate layers 14a, 14b and portions of the substrate 10 under the channel isolation region 12 are etched to form an isolation trench. An oxide layer may then be formed on the second channel layer 16b and in the isolation trench. The oxide layer is planarized to expose a surface of the second channel layer 16b using, for example, a chemical mechanical polishing (CMP) process or an etch-back process to form field oxide layers 18 defining an active region and a field region. The planarization process also forms a preliminary active pattern that includes the gate layers 14a, 14b and the channel layers 16a, 16b. The active region may have an island pattern.

Referring to FIG. 3D, an etch stop layer (not shown) is formed on the second channel layer 16b. A dummy gate layer (not shown) is formed on the etch stop layer.

The etch stop layer may comprise an insulation material such as silicon nitride that has an etch selectivity with respect to the dummy gate layer. In embodiments of the present invention, the etch stop layer may have a thickness of about 100 Å to about 200 Å. The etch stop layer may reduce or prevent etching of the second channel layer 16b during the process that etches the dummy gate layer. The dummy gate layer may be used to define a gate region. The dummy gate layer may comprise, for example, a silicon oxide layer having a thickness of about 1,000 Å to about 3,000 Å.

The dummy gate layer and the etch stop layer are subsequently etched using, for example, a dry etch process to form a gate hard mask 20 that includes an etch stop layer pattern 20a and a dummy gate pattern 20b. The etching process may be performed so as to provide the etch stop layer and the dummy gate layer with sloped sides. As a result, the gate hard mask 20 may have a trapezoidal cross-section that has a lower side which is wider than the upper side.

Referring to FIG. 3E, the preliminary active pattern may be etched using the gate hard mask 20 as an etching mask. This etching process may be used to expose a portion of the substrate 10 and to form channel layer patterns 16a' 16b' and gate layer patterns 14a', 14b'. Portions of the substrate may be etched so that the channel isolation region 12 extends above the top surface of the remainder of the substrate 10 in the active region.

Referring to FIG. 3F, the channel layer patterns 16a', 16b' and the gate layer patterns 14a', 14b' may be isotropically etched to form an active channel pattern 24. The active channel pattern 24 may have a width that is less than the width of the etched preliminary active pattern. The isotropic etching process is referred to as a trimming process because the channel length may be determined through the isotropic etching process.

To form the vertical side profile of the active channel pattern 24, the isotropic etching process may be carried out using an etching gas that has little etching selectivity between the channel layer patterns 16a', 16b' and the gate layer patterns 14a', 14b'. The isotropic etching process may comprise, for example, a chemical dry etching process that uses radicals in the etching gas. The active channel pattern 24 formed by such a chemical etching process may have a pattern size that is less than the pattern size resulting from a photolithography process.

As shown in FIG. 3G, a selective epitaxial single crystalline layer may be grown to a thickness of, for example, about 300 Å to about 400 Å on the exposed surface of the semiconductor substrate 10 and sidewalls of the active channel pattern 24 to form source/drain layers.

As shown in FIG. 3G, the active channel pattern 24 may have a width that is less than the lower width of the gate hard mask 20. As a result, the active channel pattern 24 may be masked by the gate hard mask 20. When the source/drain layers 26 are epitaxially grown from both sides of the active channel pattern 24, growth of the source/drain layers 26 is suppressed in a direction substantially parallel to both sides of the active channel pattern 24. Thus, the source/drain layers 26 mostly grow in a direction substantially perpendicular to the sides of the active channel pattern 24. Accordingly, the source/drain layers 26 have a profile that is substantially perpendicular to the substrate 10. This may facilitate formation of a silicide layer on an upper face of the source/drain layers 26 in a subsequent process.

Impurities may then be implanted into the source/drain layers 26. The impurities may be implanted in a slanted direction or a vertical direction to form doped source/drain regions 26. The impurities may have uniform concentration.

Referring to FIG. 3H, a silicon nitride layer 30 may be formed on the field region 18, the source/drain regions 26 and the gate hard mask 20. A top portion of the silicon nitride layer 30 may then be removed by, for example, a CMP process to expose the upper face of the dummy gate pattern 20b.

Referring to FIG. 3I, the dummy gate pattern 20b may then be removed. The etch stop layer pattern 20a may be partially etched to form a gate trench 32 defining a region in which an upper gate is formed. Here, since the etch stop layer 20a has a high etching selectivity with respect to the dummy gate pattern 20b, the second channel layer pattern 16b' may not be removed.

As described above, the gate hard mask 20 may have a trapezoidal cross-section. As a result, the upper width of the gate trench 32 is less than the lower width of the gate trench 32.

Referring to FIG. 3J, a silicon oxide layer (not shown) is formed on sidewalls of the silicon nitride layer 30, on the source/drain layers 26 and on the second channel layer pattern 16b''. The silicon oxide layer may then be anisotropically etched to form and inner oxide spacer 34 on the sidewalls of the gate trench 32.

The inner oxide spacer 34 narrows the width of the gate trench 32 (and hence the length of the upper gate). Since the lower portion of the oxide spacer 34 is thicker than the upper portion, the sidewalls of the gate trench 32 may have a substantially vertical profile. Accordingly, the upper gate has a length that is substantially similar to the length of the lower gate.

In further embodiments of the present invention, the impurities may be implanted into the channel layer pattern 16a" and 16b" after forming the inner oxide spacer 34, instead of implanting them in the manner described above.

As shown in FIG. 4A, at this point in the process the field region 18 may be exposed through front and rear sides of the active channel pattern 24. As shown in FIGS. 3K, 4B and 4C, the exposed field region 18 may then be partially etched to expose the front and rear sides of the active channel pattern 24 (see FIG. 4B). The gate layer patterns 14a", 14b" may then be partially removed using, for example, an isotropic etching process, to form tunnels 38 through the active channel pattern 24 (see FIG. 4C). An active pattern 40 that includes the active channel pattern 24 having the tunnels 38 and the source/drain layers 26 is formed via this isotropic etching process. The active pattern 40 may have a protruded central portion that has vertical sides.

Referring to FIG. 3L, the substrate 10 may then be thermally oxidized to form a gate insulation layer 42. In embodiments of the present invention, the gate insulation layer 42 may have a thickness of about 10 Å to about 70 Å on inner faces of the tunnels 38, on the silicon nitride layer 30 and on sidewalls of the inner oxide spacer 34. The gate insulation layer 42 may comprise, for example, a silicon oxide layer or a silicon oxynitride layer. The substrate 10 may be thermally treated at a high temperature under, for example, a hydrogen atmosphere of an argon atmosphere to improve surface roughness of the exposed layers before forming the gate insulation layer 42.

Referring to FIG. 3M, a gate conductive layer 44 is formed to fill the tunnels 38, the etched field region and the gate trench 32. A gate 50 that includes the gate insulation layer 42 and the gate conductive layer 44 is formed by this process. In embodiments of the present invention, the gate conductive layer 44 may be formed as follows. A conductive layer (not shown) such as, for example, a polysilicon or metal layer is formed of the gate insulation layer 42 to fill the tunnels 38, the etched field region and the gate trench 32. Portions of the conductive layer may then be removed by, for example, a CMP process which exposes the silicon nitride layer 30 and forms the gate conductive layer 44.

The portion of the gate 50 that extends from the upper face of the active pattern 40 is referred to herein as the upper gate 50a. The portion of the gate 50 that are formed in and adjacent the tunnels 38 is referred to herein as the lower gate 50b.

As shown in FIG. 3N, the silicon nitride layer 30 may then be removed to form the active pattern 40, the upper gate 50a and the lower gate 50b. The upper gate 50a is positioned of the upper face of the active pattern 40. The lower gate 50b is disposed in a vertical direction in the active pattern 40. The oxide spacer 34 is positioned on sidewalls of the upper gate 50a.

Additionally, impurities having a high concentration may be implanted into the source/drain layers 26 after the silicon nitride layer 30 is removed.

As shown in FIG. 3O, when polysilicon is used to form the gate electrode, a metal silicide layer 52 may be partially formed on the upper gate 50a and the source/drain layers 26. A first portion of the metal silicide layer 52 on the upper gate 50a may facilitate reducing the resistance of the upper gate 50a. A second portion of the metal silicide layer 52 on the source/drain layers 26 may likewise facilitate reducing the resistances of the source/drain layers 26 and a contact that is formed by a successive process. The metal silicide layer 52 is not formed on the sides of the upper gate 50a due to the oxide spacer 34. Thus, a short between the first and second portions of the metal silicide layer 52 may be prevented.

FIGS. 5A to 5L are cross sectional views illustrating methods of manufacturing a semiconductor device in accordance with further embodiments of the present invention.

Figure 5A:
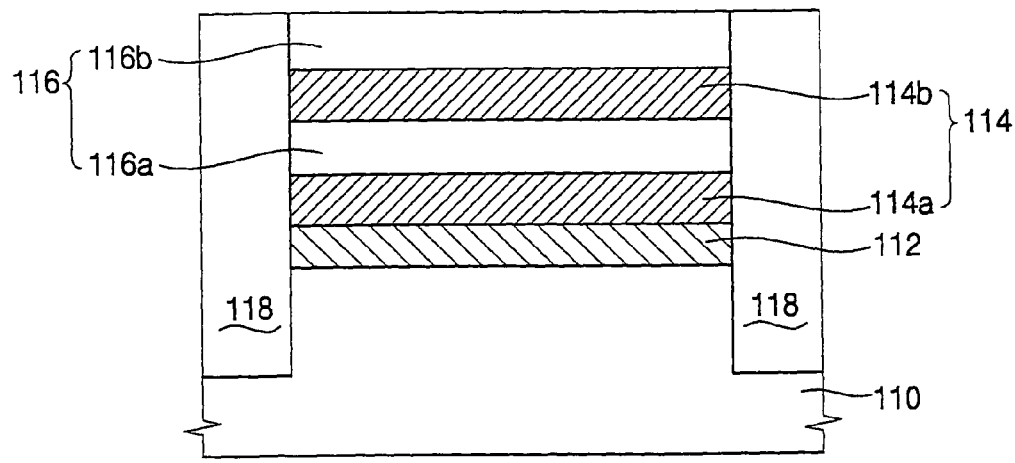
FIGS. 5A to 5L are cross sectional views illustrating methods of manufacturing semiconductor devices in accordance with second embodiments of the present invention.

Referring to FIG. 5A, a channel isolation region 112 is formed on a substrate 110. The substrate 110 may be divided into an active region and a field region 118 by processes substantially identical to the processes that are discussed above with reference to FIGS. 3A to 3C. Impurities may be implanted into the substrate 110 to form channel isolation region 112. A gate layer 114 including first and second gate layers 114a, 114b, and a channel layer 116 including first and second channel layers 116a, 116b are alternatively stacked on the channel isolation region 112.

The channel layer 116 may comprise a first single crystalline semiconductor material, and the gate layer 114 may comprise a second single crystalline semiconductor material that has an etching selectivity with respect to the first single crystalline semiconductor material. The channel layer 116 may comprise, for example, a single crystalline silicon layer having a thickness of about 300 Å. The gate layer 114 may comprise, for example, a single crystalline germanium layer or a single crystalline silicon-germanium layer having a thickness of about 300 Å.

The channel layers 116a, 116b, the gate layers 114a, 114b and portions of the substrate 110 under the channel isolation region 112 are then etched to form an isolation trench. The isolation trench may be filled with, for example, a silicon oxide layer to divide the substrate 110 into the active region and the field region 118. By the above-described process, a preliminary active pattern including the gate layer 114 and the channel layer 116 may be formed.

Figure 5B:
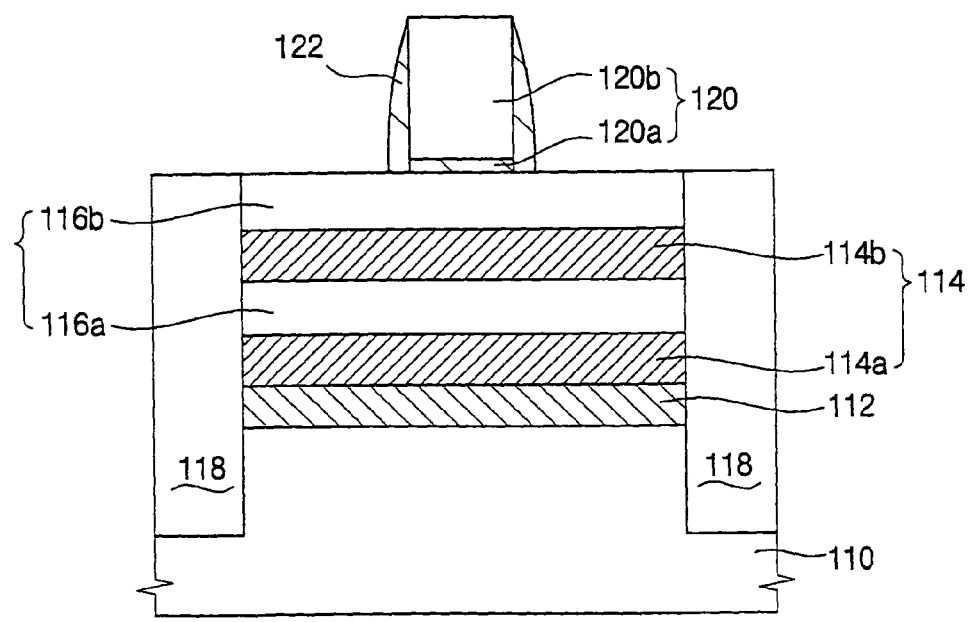

Referring to FIG. 5B, an etch stop layer (not shown) is formed on the second channel layer 16b. A dummy gate layer (not shown) is formed on the etch stop layer.

The etch stop layer may comprise an insulation material such as, for example, silicon nitride that has an etching selectivity with respect to the dummy gate layer. The etch stop layer may have a thickness, for example, of about 100 Å to about 200 Å. The etch stop layer may be used to prevent the second channel layer 16b from being etched during the etching of the dummy gate layer. The dummy gate layer may be used to define a gate region. The dummy gate layer may comprise, for example, a silicon oxide layer having a thickness of about 1,000 Å to about 3,000 Å.

The dummy gate layer and the etch stop layer may then be etched to form a gate hard mask 120 that includes an etch stop layer pattern 120a and a dummy gate pattern 120b.

A silicon nitride layer (not shown) may then be formed on the gate hard mask 120 and the second channel layer 116b. The silicon nitride layer may then be anisotropically etched to form a nitride spacer 122 on the sides of the gate hard mask 120.

Figure 5C:
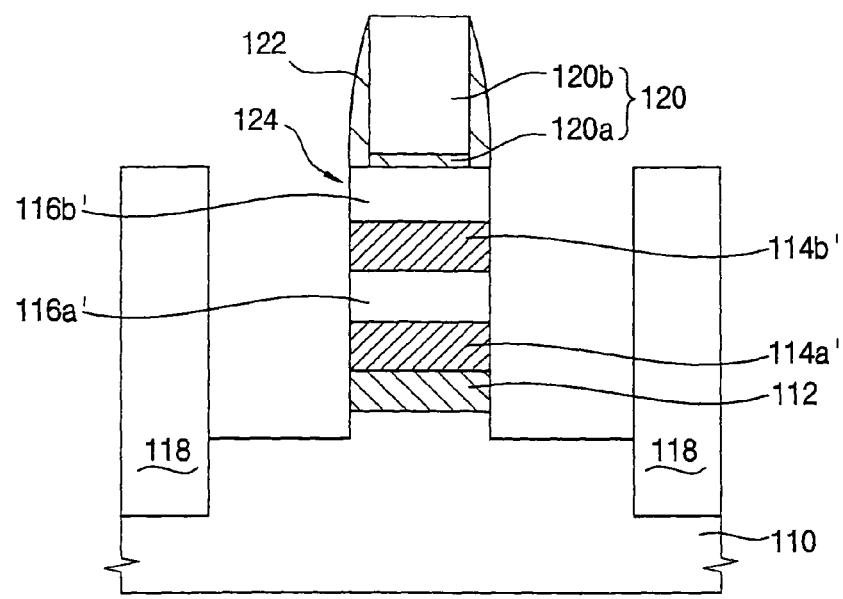

As shown in FIG. 5C, the channel layer 116 and the gate layer 114 may then be etched using the gate hard mask 120 as an etching mask to expose a portion of the substrate 110 and to form a preliminary active pattern 124. The preliminary active pattern 124 includes channel layer patterns 116a', 116b' and gate layer patterns 114a', 114b'.

Figure 5D:
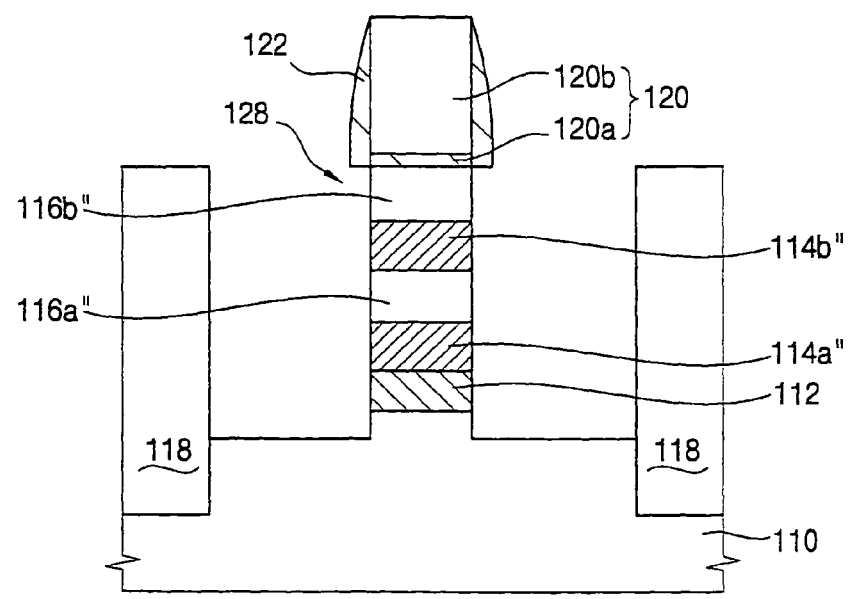

Referring to FIG. 5D, the channel layer patterns 116a', 116b' and the gate layer patterns 114a', 114b' may be isotropically etched to form an active channel pattern 128 that has a width that is less than the width of the etched preliminary active pattern 124. This isotropic etching process is referred to as a trimming process because a channel length may be determined through the isotropic etching process.

The isotropic etching process may be carried out using an etching gas that has little etching selectivity between the channel layer pattern 116 and the gate layer pattern 114. The isotropic etching process may include a chemical dry etching process using radicals in the etching gas. The active channel pattern 128 formed by the chemical etching process may have a pattern size that is less than the pattern size that would result if a photolithography process was used.

Figure 5E:
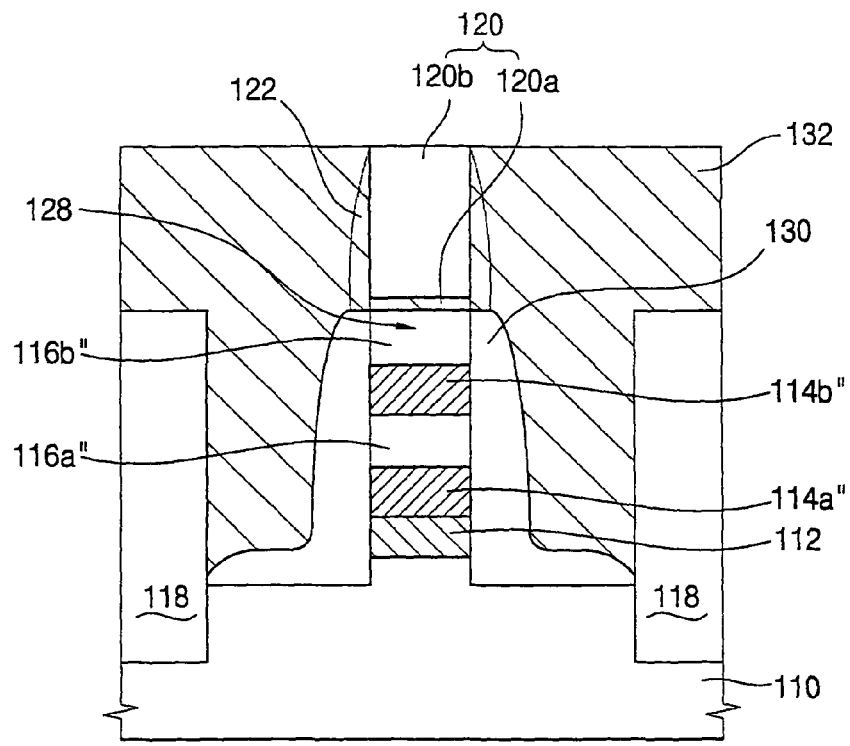

As shown in FIG. 5E, a selective epitaxial single crystalline layer may be grown to a thickness of about 300 Å to about 400 Å on the exposed surface of the semiconductor substrate 110 and both sides of the active channel pattern 128 to form source/drain layers 130. The active channel pattern 128 may have a width that is less than the lower width of the gate hard mask 120 so that the active channel pattern 128 is masked by the gate hard mask 120. When the source/drain layers 130 epitaxially grow from the both sides of the active channel pattern 128, growth of the source/drain layers 130 may be suppressed in a direction substantially parallel to the both sides of the active channel pattern 128.

Impurities may then be implanted into the source/drain layers 130 in, for example, a slant direction or in a vertical direction, to complete formation of the source/drain regions.

A silicon nitride layer 132 may then be formed on the field region 118, the source/drain layers 130 and the gate hard mask 120 to fill the space between the source/drain layers 130 and the field region 118. Portions of the silicon nitride layer 132 may thereafter be removed by a CMP process to expose the upper face of the dummy gate pattern 120b. Here, since the nitride spacer 122 includes a material substantially identical to that of the silicon nitride layer 132, the nitride spacer 122 may not be differentiated from the silicon nitride layer 132.

Figure 5F:
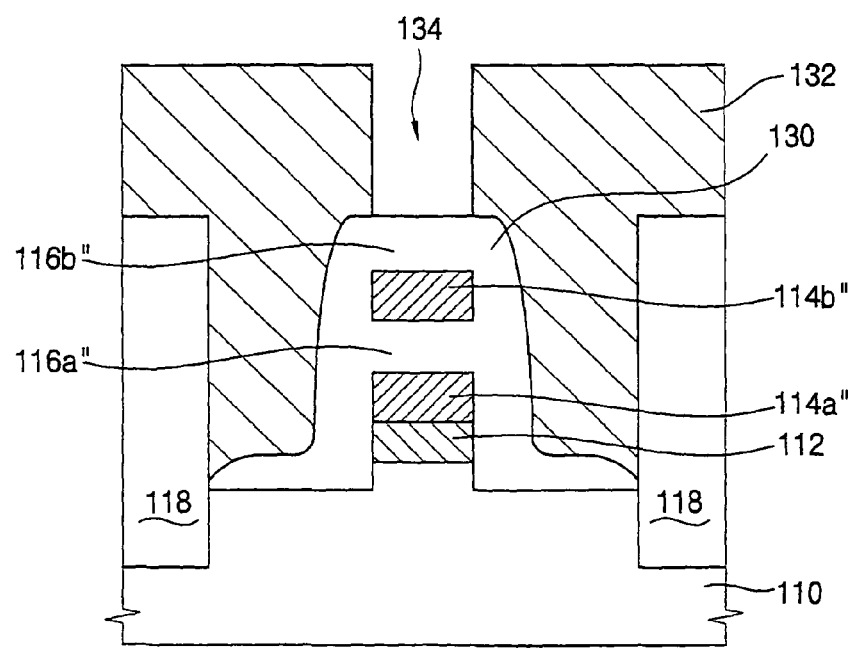

As shown in FIG. 5F, the dummy gate pattern 120b may then be removed. The etch stop layer pattern 120a is partially etched to form a gate trench 134.

In further embodiments of the present invention, the impurities may not be implanted into the channel layer patterns 116a", 116b" in the process described above. In such embodiments, the impurities may instead be implanted into the channel layer patterns 116a", 116b" after forming the gate trench 134.

Figure 5G:
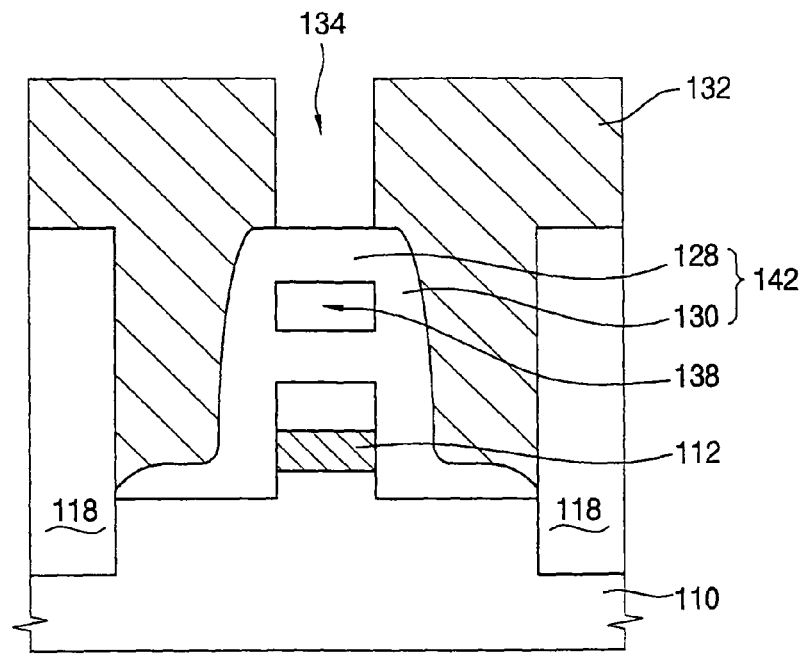

Referring to FIG. 5G, the exposed field region 112 is partially etched to expose the front and rear sides of the active channel pattern 128. The gate layer patterns 114a", 114b" may then be partially removed, for example, by an isotropic etching process to form the tunnels 138 through the active channel pattern 128.

An active pattern 142 that includes the active channel pattern 128 with the tunnels 138 and the source/drain layers 130 is formed by the isotropic etching process. The active pattern 142 includes a protruded central portion having vertical sides that extends from the top surface of the substrate 110.

Figure 5H:
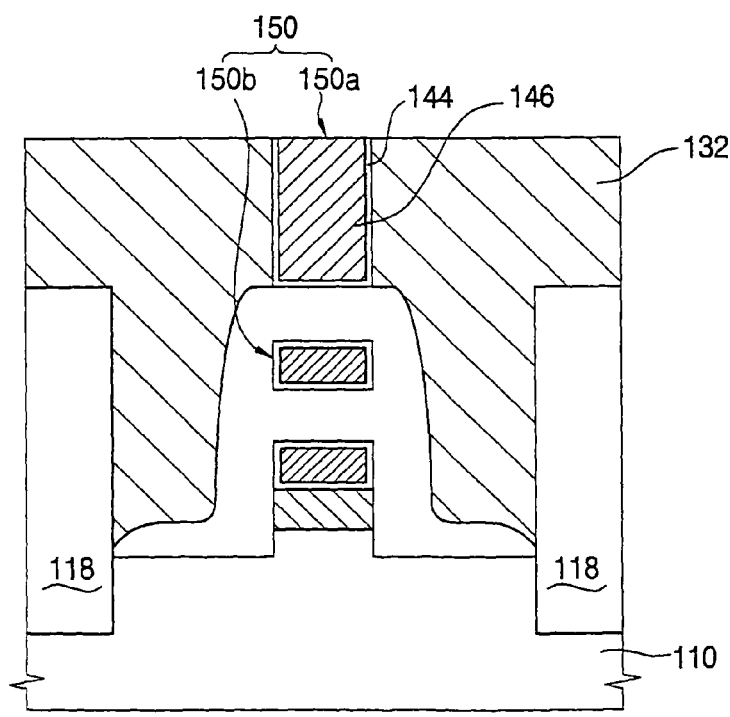

Referring to FIG. 5H, the substrate 110 is thermally oxidized to form a gate insulation layer 144 having, for example, a thickness of about 10 Å to about 70 Å. The gate insulation layer 144 may be formed on the inner faces of the tunnels 138 and on the gate trench 134. A gate conductive layer 146 is formed that fills the tunnels 138, the etched field region 118 and the gate trench 134. A gate 150 including an upper gate 150a on the active pattern 142 and a lower gate 150b horizontally penetrating through the active pattern 142 may be formed by the above-described process.

Figure 5I:
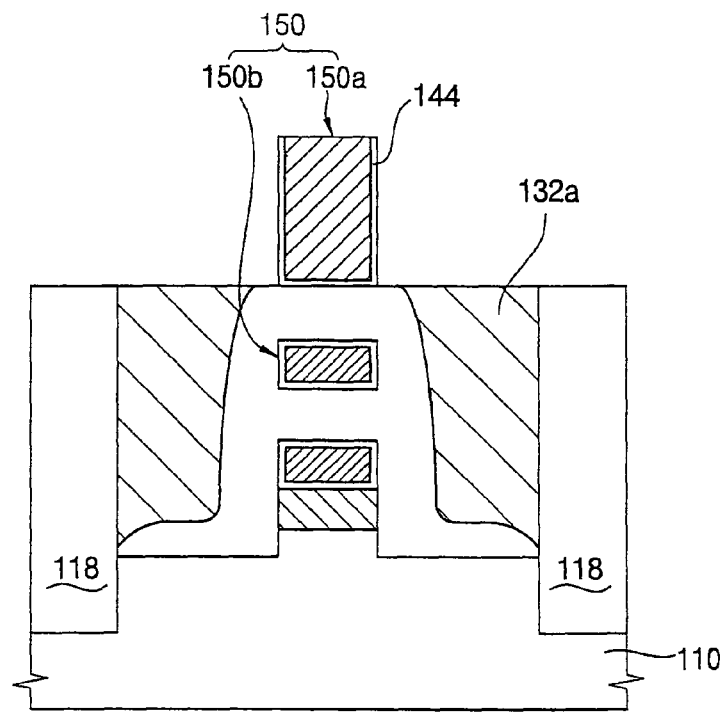

Referring to FIG. 5I, the silicon nitride layer 132 may then be partially etched to expose a surface of the field region 118 and to form an etched silicon nitride layer 132a. Thus, the upper gate 150a extends above the silicon spacer 132a.

Figure 5J:
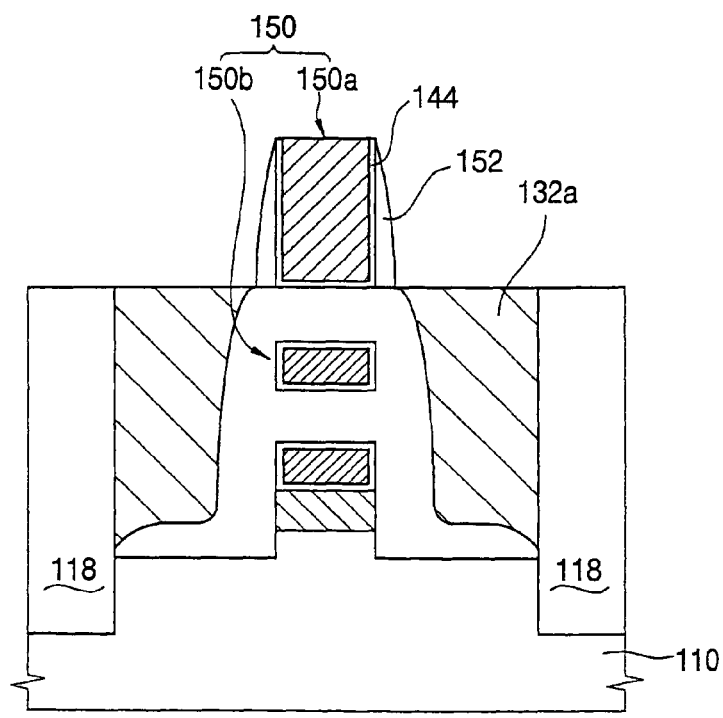

Referring to FIG. 5J, a silicon oxide layer (not shown) is formed on both sides of the upper gate 150a and on the etched silicon nitride layer 132a. As shown in FIG. 5J, the silicon oxide layer may then be anisotropically etched to form an oxide spacer 152 on both sides of the upper gate 150a.

Figure 5K:
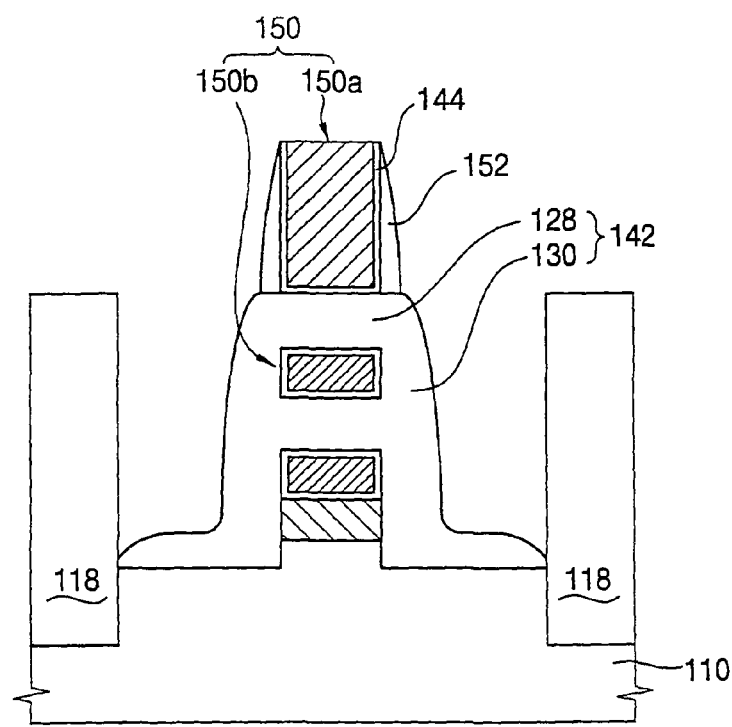

Referring to FIG. 5K, the etched silicon nitride layer 132a may then be removed to form the active pattern 142, the lower gate 150b horizontally disposed in the active pattern 142, and the upper gate 150a on the active pattern 142. The upper gate 150a is positioned on the upper face of the active pattern 142. The oxide spacer 152 is positioned on the upper gate 150a. Additionally, impurities may be implanted into the source/drain layers 26 after removing the silicon nitride layer 130.

Figure 5L:
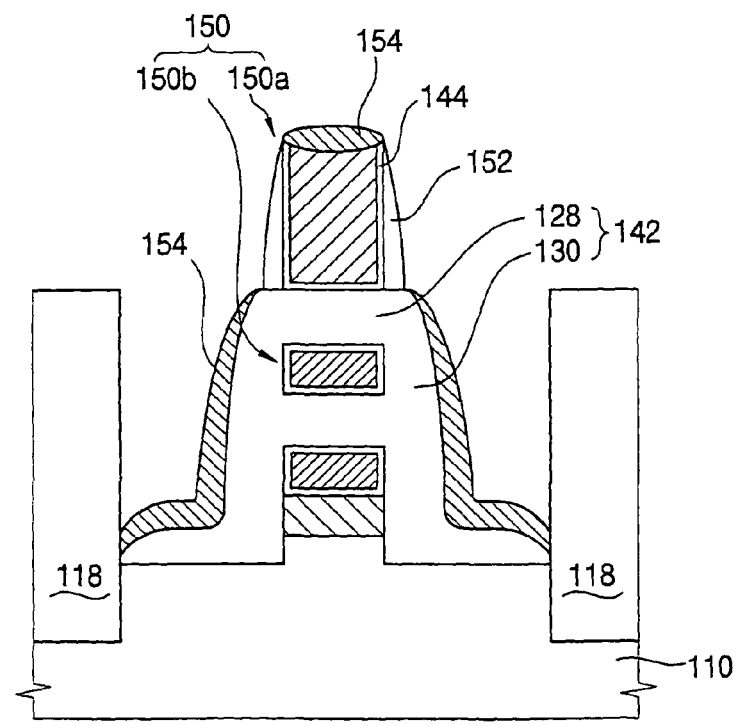

As shown in FIG. 5L, when polysilicon is used to form the a gate electrode, a metal silicide layer 154 may be selectively formed on the upper gate 150a and the source/drain layers 130.

According to embodiments of the present invention, semiconductor devices having a single active pattern that may include thin channels enclosed by the gate are provided. Since the thin channels are formed in a vertical direction, the source/drain regions may occupy a relatively smaller area within the active region.

The source/drain regions of the devices may also have a doping profile in a vertical direction with respect to the channels so that a junction capacitance of the source/drain regions may, in some instances, be maintained relatively constant regardless of the number and/or the area of the channels. This may facilitate rapid device operation.

In further embodiments of the present invention, growth of the epitaxial layer may be suppressed by the trimming process so that the source/drain layers may have an improved shape. Also, since the active pattern has the vertical side profile, the silicide layer may have uniform thickness so that the resistance of the source/drain layers may be reduced.

Additionally, although not depicted in the figures, it is noted that a highly-integrated vertical MOS transistor having multiple channels may be embodied by combining above-mentioned embodiments with each other.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An intermediate structure produced during the formation of a multi-channel MOS transistor, the intermediate structure comprising:

an active channel pattern on a substrate, the active channel pattern comprising a first semiconductor layer on the substrate, a second semiconductor layer on the first semiconductor layer, a third semiconductor layer on the second semiconductor layer and a fourth semiconductor layer on the third semiconductor layer, wherein the first and third semiconductor layers have an etching selectivity with respect to the second and fourth semiconductor layers;

a hard mask on the active channel pattern; wherein the width of a lower portion of the hard mask exceeds the width of an upper portion of the hard mask, wherein the width of the active channel pattern is less than the width of the hard mask.

2. The intermediate structure of claim 1, wherein the active channel pattern has first and second substantially vertical sidewalls extending above an upper surface of the substrate.

3. The intermediate structure of claim 2, further comprising a first semiconductor source/drain region on the first sidewall of the active channel pattern and a second semiconductor source/drain region on the second sidewall of the active channel pattern.

4. The intermediate structure of claim 1, wherein the hard mask is a stacked structure comprising a dummy gate pattern on an etch stop layer pattern.

5. The intermediate structure of claim 1, further comprising an insulation layer on the active channel pattern, the first and second semiconductor source/drain regions and the hard mask.

6. The intermediate structure of claim 1, wherein the hard mask has a trapezoidal-shaped cross-section.

7. The intermediate structure of claim 1, wherein the hard mask comprises a dummy gate pattern on an etch stop layer pattern and first and second spacers on sidewalls of the dummy gate pattern and the etch stop layer pattern.

* * * * *